United States Patent [19]

Ballas et al.

[11] 3,890,455

[45] June 17, 1975

[54] METHOD OF ELECTROLESSLY PLATING ALLOYS

[75] Inventors: Donald F. Ballas, Underhill, Vt.; San-Mei Ku, Poughkeepsie; John C. Marinace, Yorktown Heights, both of N.Y.

[73] Assignee: International Business Machines Corporation, Armonk, N.Y.

[22] Filed: June 23, 1972

[21] Appl. No.: 265,948

[52] U.S. Cl. .................... 427/85; 427/92; 427/430; 148/1.5; 148/185; 357/67

[51] Int. Cl.² ........................ H01L 7/00; B05D 5/12

[58] Field of Search ........... 117/212, 227, 213, 113, 117/47 R, 130 E; 317/234 L; 148/1.5, 185, 148/188; 357/67

[56] References Cited

UNITED STATES PATENTS

| | | | |
|---|---|---|---|
| 3,156,634 | 11/1964 | Duva et al. | 106/1 |
| 3,172,829 | 3/1965 | Bakker | 317/234 L |
| 3,214,292 | 10/1965 | Edson | 117/227 |
| 3,300,328 | 1/1967 | Luce | 106/1 |
| 3,367,792 | 2/1968 | Levine | 117/227 |
| 3,533,923 | 10/1970 | Moore | 204/43 |
| 3,586,534 | 6/1971 | Nitta | 117/227 |
| 3,589,916 | 6/1971 | McCormack | 106/1 |
| 3,647,536 | 3/1972 | King | 117/227 |
| 3,684,930 | 8/1972 | Collins | 317/234 R |
| 3,700,469 | 10/1972 | Okinaka | 117/130 E |
| 3,729,807 | 5/1973 | Fujiwara | 117/107 |
| 3,767,482 | 10/1973 | Kock | 148/177 |

*Primary Examiner*—Michael F. Esposito
*Attorney, Agent, or Firm*—Theodore E. Galanthay

[57] ABSTRACT

Disclosed is a method of electrolessly plating an alloy onto a substrate. To plate an alloy consisting of two elements requires the steps of mixing two solutions, each containing one of the elements to be alloy plated, and immersing a surface to be plated in said mixed solution for a fixed period of time until a desired thickness of alloy has been plated onto the surface.

3 Claims, No Drawings

METHOD OF ELECTROLESSLY PLATING ALLOYS

BACKGROUND OF THE INVENTION

1. Field of the Invention

This invention relates to a method of electrolessly plating an alloy and more specifically to a method of electrolessly plating gold alloys on a surface of a compound from the III–V group, or mixed compounds from the III–V group.

2. Description of the Prior Art

In the manufacture of semiconductor devices, particularly those semiconductors having substrates formed from group III–V (or mixed III–V) compounds, gold is commonly used as a contact material. However, pure gold will form Schottky barrier (metal-semiconductor rectifying) contacts. In order to make good ohmic contacts, it is necessary to dope the gold with either a N or P type impurity.

One prior art technique requires a first step of plating the gold which adheres well to the substrate. Subsequently, in a separate second step, the desired dopant is deposited over the gold film. The resultant composite plate is then heated to diffuse the impurity through the gold to the surface of the substrate. This technique is not only expensive because of the separate required steps but also results in an undesirable, uneven diffusion profile in that the lowest concentration of impurity is found near the gold-substrate interface and the largest impurity concentration is near the upper surface of the resultant contact.

Another prior technique relates to the electrolytic plating of an alloy consisting of gold and a desired impurity. Although this technique avoids the separate deposition steps for each element and the subsequent undesirable diffusion profile, other disadvantages are encountered. In this technique, the plating current must be carefully adjusted to the area to be plated. Assuming that the substrate is a thin semiconductor wafer only a few mils thick and several inches in diameter, such a uniform plating current is difficult to obtain. Assuming further that the semiconductor wafer is selectively masked with photoresist material in accordance with well-known semiconductor manufacturing techniques, the size of the openings in the photoresist material determine the current density and hence the rate of plating of a particular contact hole. A further disadvantage of this technique is that the anode in the electrolytic process must be made carefully in precise ratios of concentration of the gold and the desired impurity. A still further disadvantage rests with the electrolytic solution itself which normally contains cynide and is therefore not only costly but hazardous.

SUMMARY OF THE INVENTION

It is therefore the primary object of this invention to electrolessly plate an alloy onto a surface.

It is a further object of this solution to plate a uniform thickness of alloy over selected regions of a semiconductor wafer.

It is a further object of this invention to provide doped gold ohmic contacts to a semiconductor surface.

It is a still further object of this invention to electrolessly plate an alloy having a uniform composition of elements.

DESCRIPTION OF THE PREFERRED EMBODIMENTS

The foregoing and other objects of this invention as well as features and advantages thereof will be more apparent from the following detailed description and appended claims.

In accordance with the present invention, an alloy of uniform composition is plated out from a solution by an electroless process. By way of example, various alloys of gold are electrolessly plated onto a surface to which gold adheres well. One such surface is formed from semiconductor compounds from the III–V group and mixed semiconductor compounds from these groups. The semiconductor compounds include GaAs, GaP, GaAsP, AlGaAs, etc. These compounds are well known in the semiconductor industry and are normally used as substrates for semiconductor devices. A semiconductor wafer formed from such a compound normally has a thickness in the order of 3–15 mils and a diameter in the order of ½ to 3 inches, and forms a substrate for hundreds of semiconductor devices. After the devices have been formed in the substrate, it is necessary to form ohmic contacts to each of the devices. This is normally done by selectively masking the surface of the wafer with a photoresist material, for example, and thereafter plating ohmic contacts to those areas of the wafer where the photoresist material has been selectively removed. In the present example, gold is used as the primary contact material because of its good adhesion properties to group III–V compounds as well as its high electrical conductivity. It will be understood that for the purposes of this invention, the properties of semiconductor compounds from the group III–V elements are similar to those of the mixed compounds of such elements so that all the aforementioned elements will be referred to, in this specification and the claims, as semiconductor materials from the group III–V elements.

As previously described, in order to avoid a Schottky barrier diode contact with the gold material, the gold is doped with an impurity (either N or P type) to form an ohmic contact. If a P type contact is desired, a metal such as zinc provides a suitable impurity. By way of specific example, 400 milligrams (mg) of zinc chloride ($ZnCl_2$) are added to 50 millileters (ml) of gold chloride solution ($HAuCl_4.3H_2O$). Approximately 1.5 grams of gold chloride are used with approximately 400 milligrams of zinc chloride crystals to obtain a plated layer consisting of zinc in the amount of approximately 100 to 1,000 parts per million (ppm). If it is desired to increase the amount of zinc in the alloy, the amount of zinc crystals may be increased with respect to the weight of the crystalline gold chloride. Similarly, if it is desired to increase the amount of gold in the alloy the crystalline gold chloride could be increased to 3 grams, for example, and/or the weight of the zinc chloride crystals could be decreased to 200 milligrams, for example. The surface to be plated, such as the semiconductor wafer from the group III–V compounds is then immersed in the solution for two to three minutes to form a gold-zinc alloy plated layer approximately 2,000–2,500A. in thickness. This process is normally performed at room temperature although it is recognized by those skilled in the art that increased temperature will increase the deposition rate. Those skilled in the art will recognize that substances other than semiconductors from the group III–V compounds, can be plated with alloys other than gold-zinc alloys. It is only necessary that the elements to be plated be soluble in a miscible solution and that the major element in the alloy adhere well to the surface to be plated. It is further desirable that the elements to be plated have uniform rates of plating out so that the ratio of the two rates is constant during the time interval required for a sufficient thickness of plating. The worst case results if one of the elements to be plated impedes the plating of other elements in the solution. Selective masking of the substrate surface allows deposition to take place only in the selected contact areas. A number of masking materials such as photoresist and silicon dioxide ($SiO_2$) as well as others, are known in the semiconductor industry. In the present case, if a masking material other than $SiO_2$ is used, a few drops of Hydrofluoric Acid (HF) added to the electrodes plating solution will further prevent oxidation of the surface to be plated thereby promoting better adhesion and electrical properties.

In the event that an N-type contact is desired, tin (Sn) can be electrolessly alloy deposited with the gold. By way of specific example, a 100 milligrams (mg) of crystalline stannous chloride ($SnCl_2.2H_2O$) are added to 50 millileters (ml) solution of gold chloride ($HAuCl_4.3H_2O$). The 50 millileter solution of gold chloride contains 1.5 grams of crystalline gold chloride for the desired rate of gold deposition. A dark redish brown precipitate appears, probably a stannic chloride material. The precipitate is either filtered off or dissolved by the addition of a few millileters (ml) of hydrochloric acid (HCl). The addition of the few millileters of hydrochloric acid maintains the amount of crystalline stannous chloride in the solution constant. The substrate such as gallium arsenide (GaAs) is immersed in the solution for two to three minutes for a plated layer of approximately 2,000–2,500A. Spectographic analysis of the plated layer shows about 100 parts per million (ppm) of tin in the gold. In both the foregoing specific examples, superior ohmic contacts are obtained because of the constant diffusion profile. Subsequent annealing at 450°C in a forming gas atmosphere assures the good ohmic contact. The forming gas consists of an inert gas such as nitrogen with approximately 5 to 10% hydrogen in order to reduce any possible oxide.

Those skilled in the art will recognize that this invention is not limited to two alloys. Rather, any number of elements meeting the compatibility cirteria disclosed herein can be plated out as an alloy.

While the invention has been particularly shown and described with reference to the preferred embodiments thereof, it will be understood by those skilled in the art that these and other various changes in form and detail may be made therein without departing from the spirit and scope of the invention.

What is claimed is:

1. Method of electrolessly plating a doped gold alloy contact onto the surface of a semiconductor substrate including elements from the group III–V elements or mixed compounds of these elements, comprising the steps of:

mixing a gold chloride solution with a solution of zinc chloride in the ratio of 1.5 grams to 3.0 grams crystalline gold chloride to 400 milligrams to 200 milligrams zinc for a solution of 50 millileters; and immersing the semiconductor substrate in said mixed solution for a fixed period of time until a desired thickness of doped gold alloy has been plated onto said substrate, thereby plating zinc doped gold onto said semiconductor substrate at an initial rate of 2,000 to 2,500 angstroms in approximately 2–3 minutes at room temperature.

2. Method of electrolessly plating a doped gold alloy contact onto the surface of a semiconductor substrate including elements from the group III–V elements or mixed compounds of these elements, comprising the steps of:

mixing a gold chloride solution with crystalline stannous chloride in the ratio of approximately 1.5 grams of crystalline gold chloride to approximately 100 milligrams of crystalline stannous chloride for a 50 milliliter solution;

adding a few millileters of hydrochloric acid to dissolve any resultant precipitate; and immersing the substrate in said mixed solution for a fixed period of time until a desired thickness of alloy has been plated onto said substrate, thereby plating tin doped gold onto said semiconductor substrate at an initial rate of 2,000 to 2,500 angstroms in approximately 2–3 minutes at room temperature.

3. Method as in claim 2 wherein:

the step of adding hydrochloric acid is omitted and in its place is substituted the step of filtering off any resultant precipitate.

* * * * *